(12) United States Patent
Takechi et al.

(10) Patent No.: US 6,801,050 B2
(45) Date of Patent: Oct. 5, 2004

(54) DRIVER CIRCUIT INTEGRATED WITH LOAD CURRENT OUTPUT CIRCUIT, PIN ELECTRONICS AND IC TESTER HAVING THEREOF

(75) Inventors: Keizo Takechi, Tokyo (JP); Akio Ohsaki, Tokyo (JP); Yoshihiko Hayashi, Tokyo (JP); Kazuhiko Murata, Tokyo (JP)

(73) Assignees: Hitachi, Ltd., Tokyo (JP); Hitachi Hi-Tech Electronics Engineering Co., Ltd., Tokyo (JP)

( * ) Notice: Subject to any disclaimer, the term of this patent is extended or adjusted under 35 U.S.C. 154(b) by 0 days.

(21) Appl. No.: 10/032,761

(22) Filed: Dec. 27, 2001

(65) Prior Publication Data
US 2002/0171446 A1 Nov. 21, 2002

(30) Foreign Application Priority Data
May 21, 2001 (JP) ........................................ 2001-150853

(51) Int. Cl.$^7$ ............................................. G01R 31/02
(52) U.S. Cl. ..................... 324/765; 324/158.1; 714/724
(58) Field of Search ................................ 324/765, 754, 324/158.1, 73.1, 72.5, 755, 761, 769, 725; 714/724, 719, 732, 736; 365/201

(56) References Cited

U.S. PATENT DOCUMENTS

| | | | | |
|---|---|---|---|---|
| 4,523,312 A | * | 6/1985 | Takeuchi | ...................... 714/700 |
| 5,200,696 A | * | 4/1993 | Menis et al. | ............. 324/158.1 |
| 5,521,493 A | * | 5/1996 | Persons | .................... 324/158.1 |
| 5,543,728 A | * | 8/1996 | Grace et al. | ................. 324/763 |
| 6,031,370 A | * | 2/2000 | Kataoka | .................... 324/158.1 |
| 6,275,023 B1 | * | 8/2001 | Oosaki et al. | ............ 324/158.1 |
| 6,498,473 B1 | * | 12/2002 | Yamabe | .................... 324/158.1 |

FOREIGN PATENT DOCUMENTS

JP          04-339281          11/1992

* cited by examiner

*Primary Examiner*—David A. Zarneke
*Assistant Examiner*—Jimmy Nguyen
(74) *Attorney, Agent, or Firm*—Townsend and Townsend and Crew LLP

(57) ABSTRACT

A driver circuit integrated with a load current output circuit has a function as a driver for applying a predetermined test waveform to a device under test (DUT), and a function as a load current output for reproducing an actual use situation by receiving the load current to the DUT to judge a response waveform by receiving the response waveform from the DUT. Both functions are made up on a common circuit, operate as the driver circuit when applying the test waveform, and operate as the load current output circuit when judging the response waveform.

10 Claims, 8 Drawing Sheets

| ITEMS | INTEGRAL-TYPE DRIVER | CONVENTIONAL | |
|---|---|---|---|
| | | DRIVER | DYNAMIC LOAD |
| ELECTRICITY CONSUMPTION | 4.5W | 3.6W | 3.5W |
| | | 7.1W | |
| CHIP AREA [mm²] | 4.0×4.0 =16.0 | 3.7×3.7 =22.69 | 3.0×3.0 |
| MOUNTING AREA [mm²] | 460 | 690 | |

| ITEMS | CIRCUIT SYSTEM OF FIG. 2 | CIRCUIT SYSTEM OF FIG. 3 |
|---|---|---|
| ELECTRICITY CONSUMPTION | 700mW | 1500mW |
| CHIP AREA [mm$^2$] | 0.7 (CONVENTIONALLY 1.0) | 0.7 (CONVENTIONALLY 1.0) |
| RISING TIME (1.6V) | 200ps | 300ps |

DRIVER CIRCUIT INTEGRATED WITH LOAD CURRENT OUTPUT CIRCUIT, PIN ELECTRONICS AND IC TESTER HAVING THEREOF

FIELD OF THE INVENTION

The present invention relates to a driver circuit for outputting a load current to an electric device and an IC tester, and in particular, relates to a driver circuit integrated with a load current output circuit that functions as both a load current output circuit and a driver circuit while having smaller circuit scale and chip area than the scale and area required for two circuits, and which is also capable of reducing a electricity consumption to a level lower than what two circuits would consume, and pin electronics and IC tester having thereof.

DESCRIPTION OF THE RELATED ART

In an IC tester, a test wave form is applied to a predetermined terminal to judge (hereinafter referred to as a judge mode), by the judge circuit thereof, whether a response waveform outputted from an output terminal (or input/output terminal) of a device under test (hereinafter referred to as DUT) such as a semiconductor after a predetermined time from the application of the test waveform is in a high level (hereinafter referred to as, "H") or a low level (hereinafter referred to as, "L") corresponding to a strobe signal generated with a predetermined timing (hereinafter referred to as a judge mode) so as to conduct an operation test or performance test or the like of the DUT by comparing the obtained result with an expected value. When judging a state of the response waveform in the above-described manner with respect to a nonterminal device, the judgment is performed by supplying, to a predetermined output terminal, a predetermined current value (a load current of about several mA to several tens of mA, for example) corresponding to an output waveform of either "H" or "L". For the purpose thereof, the IC tester is provided with a load current output circuit for supplying a load current to the output terminal of the DUT during the judge mode.

The load current output circuit is normally connected to the output terminal via an internal diode switch circuit. The load current output circuit operates only under the judge mode, and does not output the load current while a driver connected to the output terminal is under operation and a voltage is being applied.

FIG. 9 is a diagram illustrating a circuit structure of a pin electronics of a conventional IC tester. The pin electronics 2 is constituted of a driver 20 for applying a voltage set in advance to a predetermined terminal of a device under test 25 (hereinafter, referred to as DUT), an output resistor 23, a comparator 21 for judging a state of response waveform outputted from the DUT 25, a load current output circuit 28 for receiving (or deriving) the load current or supplying a predetermined load current to the terminal when gaining the response waveform from the DUT 25. The DUT 25 is connected to the driver 20, the comparator 21, and the load current output circuit 28 via a transmission line 24. A number of pin electronics circuits prepared for is the same as a number of I/O pin of each device multiplied by a number of measurement devices, thereby respective response waveform (output waveform from the output terminal) is simultaneously level-judged with respect to a plurality of the DUT.

FIG. 10 is an output buffer circuit of a conventional driver. The output buffer circuit is constituted of an input stage push-pull circuit constituted of transistors Q1 and Q2, a first output stage buffer amp constituted of transistors Q3 and Q5 for receiving phase output of the push-pull circuit, a second output stage buffer amp constituted of transistors Q4 and Q6. The maximum output current of the driver is 60 mA, and the current of up to 60 mA flows though the transistors Q5 and Q6.

FIG. 11 is a current buffer circuit of a conventional load current output circuit. The current buffer circuit includes an input stage push-pull circuit constituted of diodes D1, D2, D3, and D4, and transistors Q1 and Q2, an output stage buffer amp constituted of transistors Q3 and Q4 for receiving a phase output of the push-pull circuit, and a diode switch circuit constituted of bridge circuits of diodes D5, D6, D7, and D8. The maximum output of the load current is 25 mA, and the current of up to 25 mA flows through the transistors Q3 and Q4 and the diodes D5, D6, D7, and D8. In the present example, the diode bridge circuit constituted of the diodes D5 to D8 is discretely structured.

As such, in the prior art, the output buffer circuit of the driver and the current buffer circuit of the conventional load current output circuit have many commonalities between their output stage buffer. Also, both of these circuits do not operate redundantly while the driver is under operation and the load current output circuit is under operation.

In the above-described conventional technique, the load current output circuit and the driver circuit are made up on separate chips, or even if on the same chip, they are made as a separate circuit. However, with such structure, an IC tester is becoming larger because a large number of pin electronics circuits are used due to an increased capacity of DRAM in recent years and an increased number of pins for the IC tester for improving testing efficiency due to higher throughput. Moreover, when a number of pins is increased, a problem such as an increase of electricity consumption thereof arises.

In the conventional technique, the output buffer circuit of the driver and the current buffer circuit of the conventional load current output circuit have many commonalities between their output stage buffers, and both circuits do not operate redundantly when the driver operates and the load current output circuit operates.

SUMMARY OF THE INVENTION

The present invention has been achieved in view of the above, and an object thereof is to provide a driver circuit integrated with a load current output circuit, and a pin electronics and an IC tester having thereof, which is capable of reducing a circuit scale and a chip area as well as electricity consumption thereof when the driver circuit and the load current output circuit for an electronics device are packed on one chip.

In order to achieve such object, a driver circuit integrated with a load current output circuit, and pin electronics and IC tester having thereof according to the present invention provides a driver circuit that functions as a load current output circuit for an electronics device and as a driver circuit, and includes a common buffer circuit that includes a current buffer circuit for the load current output circuit and the output buffer circuit for the driver circuit as a common circuit therefor.

These and other objects, features and advantages of the invention will be apparent from the following more particular description of preferred embodiments of the invention, as illustrated in the accompanying drawings.

DESCRIPTION OF THE PREFERRED EMBODIMENTS

Hereinbelow, embodiments of the present invention will be described with reference to the drawings.

Figure 1:
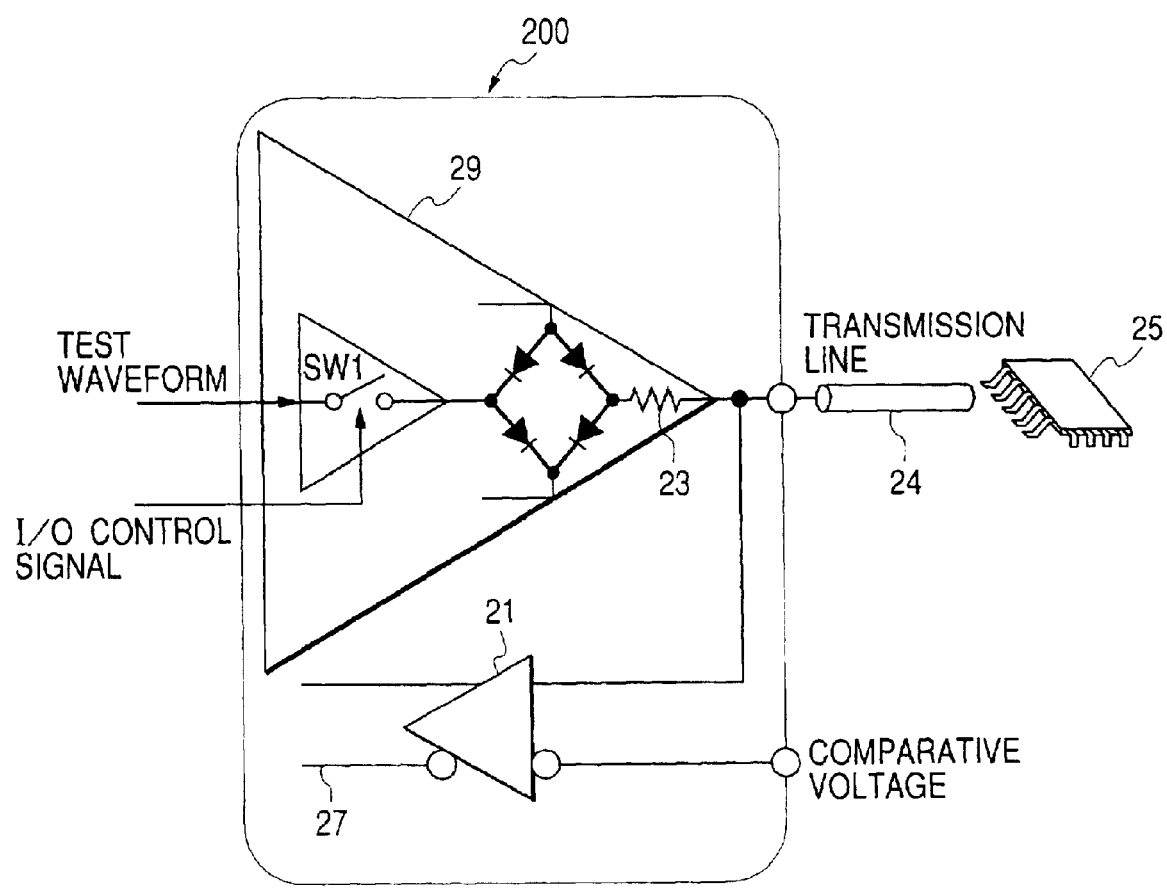
FIG. 1 is a block diagram of a circuit illustrating one embodiment of pin electronics of an IC tester according to the present invention.

FIG. 1 is a circuit block diagram showing one embodiment of pin electronics of an IC tester according to the present invention. A pin electronics 200 includes a comparator 21 for judging a state of a response waveform outputted from a DUT 25, and a driver integrated with a load current output circuit 29 for applying a preset voltage to a predetermined terminal of the DUT 25, the driver being provided with a function of a load current output circuit for supplying a predetermined load current to its terminal when obtaining the response waveform from the DUT 25 or for receiving a sink current of the load current. The DUT 25 is connected to the driver integrated with the load current output circuit 29 and the comparator 21 via a transmission line 24. A compared result at the comparator 21 is outputted to a terminal 27.

By using the pin electronics 200, an example of testing the DUT 25 will be described. A constant voltage is supplied from the driver 29 to an input voltage of the DUT 25, and while retrieving, i.e., outputting, the current from an output terminal of the DUT 25, the comparator 21 compares a voltage of the output terminal with a reference voltage so as to judge whether the DUT 25 is good or bad. As for the DUT 25 with a writing function, writing is performed by supplying a constant voltage to the input terminal of the DUT 25 from the driver 29 during the first test. In the second test, the constant voltage is supplied from the driver 29 to a predetermined terminal of the DUT 25 so as to execute a read out command, and the quality of the DUT 25 is determined by comparing a voltage of the output terminal with the reference voltage as the current being retrieved from the DUT 25. As such, a predetermined current is retrieved, i.e., outputted, from the DUT 25 for simulating a load circuit connected to the DUT 25.

Next, a specific circuit of the pin electronics shown in FIG. 1 will be described with reference to FIG. 2.

Figure 2:
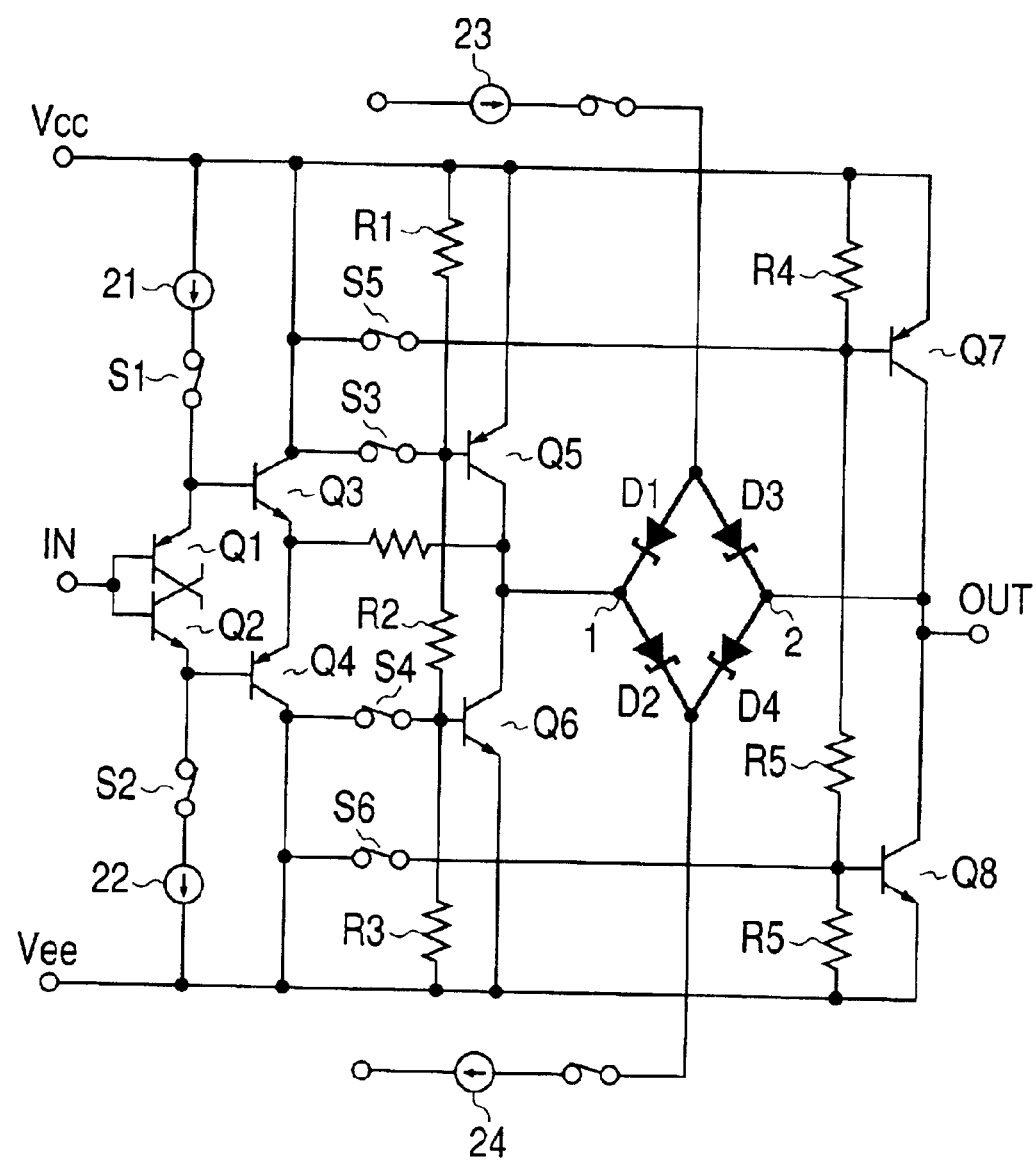
FIG. 2 is a circuit diagram illustrating one embodiment of a driver circuit integrated with a load current output circuit according to the present invention.

FIG. 2 is a circuit diagram showing one embodiment of a driver circuit integrated with a load current output circuit according to the present invention. The driver circuit integrated with the load current output circuit shown in FIG. 2 includes an input stage push-pull circuit constituted of transistors Q1 and Q2, a first output stage buffer amp for a load current output circuit constituted of transistors Q3 and Q5 for receiving a phase output of the push-pull circuit, a second output stage buffer amp for a load current output circuit constituted of transistors Q4 and Q6, a first output stage buffer amp for a driver circuit constituted of transistors Q3 and Q7 for receiving phase output of an input stage push-pull circuit, a second output stage buffer amp for a driver circuit constituted of transistors Q4 and Q8, and a diode switch circuit bridge-connecting diodes D1, D2, D3 and D4. Switches S1 and S2 provided at an emitter side of transistors Q1 and Q2, respectively, of the input stage push-pull circuit is a circuit for blocking bias current. Switches S3 and S4 are provided respectively between power lines Vcc, Vee and bases of the transistors Q5 and Q6 of the output stage buffer amp for the load current output circuit as a circuit for cutting off the respective output stage transistors Q5 and Q6. Switches S5 and S6 are provided respectively between power lines Vcc, Vee and bases of the transistors Q7 and Q8 of the output stage buffer amp for the driver circuit as a circuit for cutting off the respective output stage transistors Q5 and Q6. These switches S1 to S6 are turned ON/OFF by a control signal to disconnect input and output of the driver circuit and the load current output circuit. In the present embodiment, the transistors Q3 and Q5, and transistors Q4 and Q6 are Darlington-connected. Moreover, the transistors Q5 and Q6, or the transistors Q7 and Q8 are constituted of a voltage follower of push-pull operation.

With such structure, the switches S1 and S2 are turned ON when the DUT is tested by using an IC tester having the pin electronics, and turned OFF when it is not tested so as to prevent the current from leaking.

If the switch S3 is turned on at that time, the transistor Q5 for the load current output circuit is cut off, and connection to the transistor Q3 of a prior stage is terminated. When the switch S3 is turned OFF, a base current is supplied from a bias resistor R1, and the transistor Q5 is switched ON.

As the switch S4 is turned ON, the transistor Q6 for the load current output circuit is being cut off, and connection with the transistor Q4 of the prior stage is disconnected. When the switch S4 is turned OFF, the base current is supplied from a bias resistor R2, and the transistor Q6 is turned ON. A resistor R3 is a bias resistor connected between power source Vee and a base of the transistor Q6.

Likewise, when the switches S5 and S6 are turned ON, the transistors Q7 and Q8 for the driver circuit are cut off, and connection to the transistors Q3 and Q4 of the prior stage are disconnected. On the other hand, when these switched are turned OFF, bias resistors R4 and R5 supply base current to the transistors Q7 and Q8, and the transistors Q7 and Q8 are turned ON, and the circuit thereof performs buffer operation.

The resistor R6 is a bias resistor connected between the transistor Q8 and the power source Vee.

When the circuit shown in FIG. 2 is used as the output stage buffer for the driver circuit, the switches S3 and S5 or the switches S4 and S6 are turned off. Specifically, when "H" is generated to the output terminal OUT, the "H" voltage is supplied to the input terminal IN. In this case, the switches S3 and S5 are turned OFF and the switched S4 and S6 are turned ON so as to turn ON the transistors Q3, Q5, and Q7 and turn OFF the transistors Q4, Q6 and Q8. On the contrary, when the voltage "L" is to be generated at the output terminal OUT, the voltage "L" is supplied to the input terminal IN, and the switches S3 and S5 are turned ON while the switches S4 and S6 are turned OFF so as to turn OFF the transistors Q3, Q5 and Q7 and turn ON the transistors Q4, Q6 and Q8.

When the transistor Q3, Q5 and Q7 are turned ON, the current flows into the DUT through the transistor Q7 from the power source Vcc, the current flows to the DUT from a constant current portion 23 through the diode D3, and the current flows to the constant current portion 24 through the diode D2 so as to turn the voltage at the output terminal OUT to "H". The current value of the constant current portion may be varied according to a voltage outputted from the output terminal OUT. As such, the output terminal OUT is maintained to the constant voltage.

As the transistors Q4, Q6, and Q8 are turned ON, the current flows from the DUT through the transistor Q8 to the power source Vee, the current flows to the constant current portion 24 through the diode D4 from the DUT, and the current flows from the constant current 23 through the diode D1 and the transistor Q6 to the power source Vee so as to turn the output terminal OUT to "L". The current value of the constant current portion may be changed according to a voltage outputted from the output terminal OUT. As such, the output terminal OUT is maintained to the constant voltage.

When using as the load current output circuit, the switches S5 and S6 are turned ON so as to turn off the transistors Q7 and Q8. When the current is supplied to the DUT, the transistors Q3 and Q5 are turned ON so as to turn OFF the transistors Q4 and Q6. On the contrary, when the current is flowed into the load current output circuit from the DUT, the transistors Q3 and Q5 are turned OFF so as to turn ON the transistors Q4 and Q6.

The terminal OUT, i.e., the terminal voltage of the DUT, is lower than a set voltage of the input terminal IN of the driver circuit integrated with the load current output circuit, i.e., when the DUT generates output signals of "L", a first terminal 1 of the diode switch circuit is higher than a second terminal 2 thereof, whereby the diodes D1 and D4 are turned OFF and the diodes D2 and D3 are turned ON. As a result, the output current of the transistor Q5 of the output buffer amp flows into the constant current portion 24 controlled by a desired value externally by the control signal through the diode D2. Moreover, a current from the constant current portion 23 controlled to the desired current value flows to the DUT through the diode D3 via the output terminal OUT so as to output the load current therefrom.

The output terminal OUT of the driver circuit integrated with the load current output circuit, i.e., the terminal voltage of the DUT, is higher than a set voltage of the first terminal 1 of the driver circuit integrated with the load current output circuit, in other words, when the DUT generates the output signal of "L", the first terminal 1 of the diode switch circuit is lower then the second terminal 2 thereof, whereby the diodes D1 and D4 are turned ON and the diodes D2 and D3 are turned OFF. Accordingly, the current of the constant current portion 23 flows into the output buffer amp Q6 through the diode D1. Moreover, the current from the DUT flows to the constant current portion 24 through the diode D4 via the output terminal OUT so as to draw the load current.

In order to evaluate the circuit, SPICE simulation is performed. The result of the simulation will be described with reference to FIG. 3.

Figure 3A:
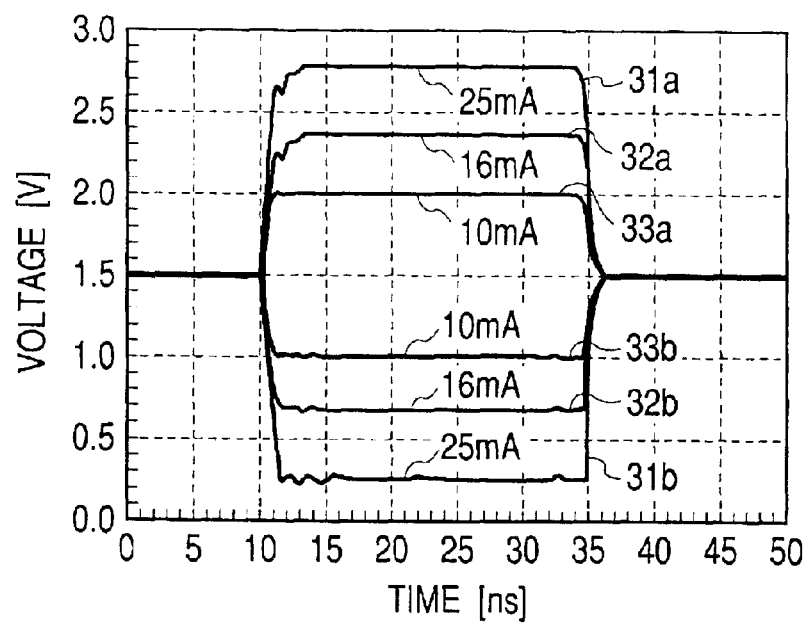
FIG. 3A is a waveform diagram showing ON/OFF state of a load current output circuit of a driver circuit integrated with a load current having the present invention applied thereto.
Figure 3B:
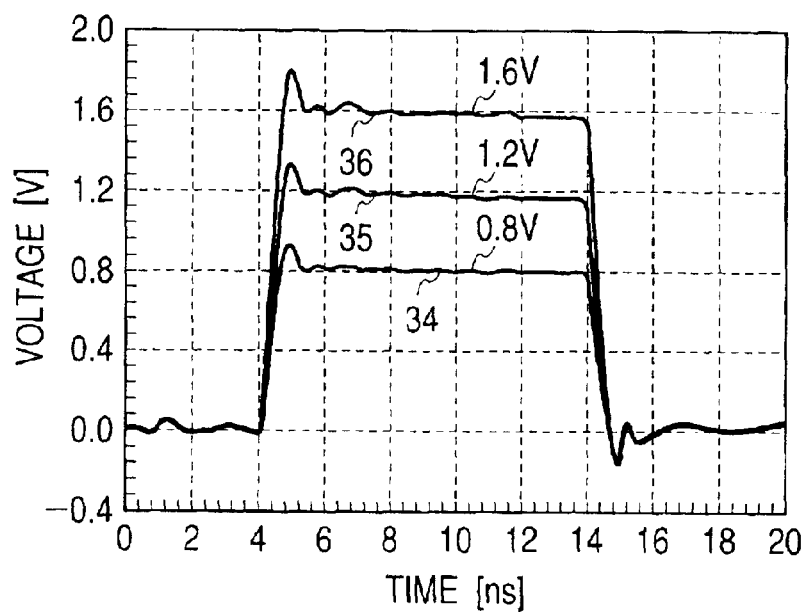
FIG. 3B is a driver waveform diagram of a driver circuit integrated with a load current having the present invention applied thereto.
Figure 4A:
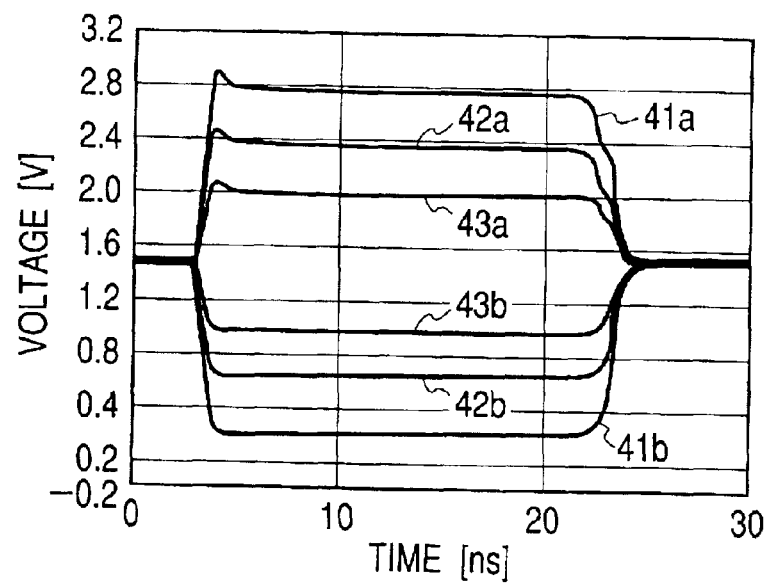
FIG. 4A is a diagram showing a ON/OFF waveform of a load current output circuit of a conventional driver circuit.
Figure 4B:
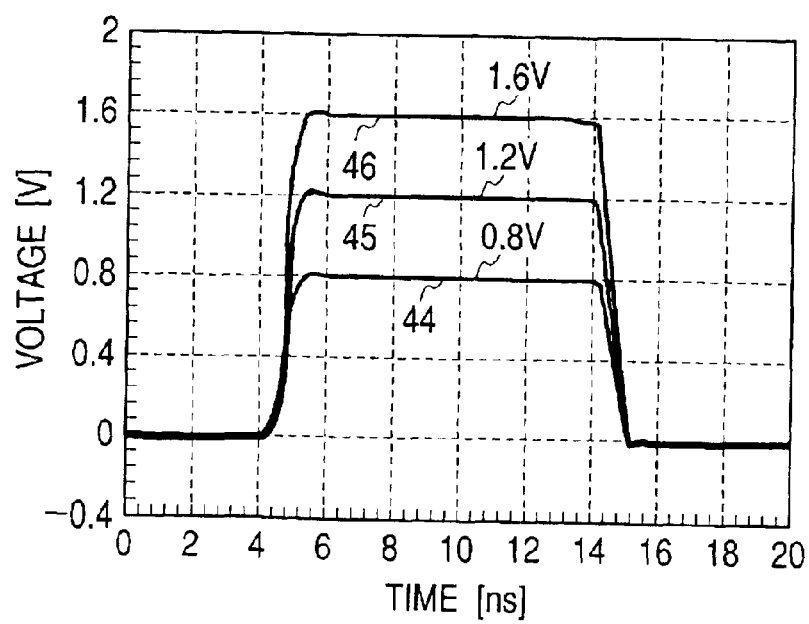
FIG. 4B is a driver waveform diagram of a conventional driver circuit.

FIG. 3A is a diagram showing an ON/OFF waveform of the load current output circuit of the driver circuit integrated with the load current to which the present invention is applied, and FIG. 3B is a diagram showing a driver waveform of the driver circuit integrated with the load current to which the present invention is applied. FIG. 4A is a diagram showing an ON/OFF waveform of a load current output circuit of a conventional driver circuit, and FIG. 4B is a diagram showing driver waveform of a conventional driver circuit. In all the figures above, a horizontal axis represents time (ns) and a vertical axis represents voltage (V).

The load current output circuit evaluate based mainly on an ON/OFF switching time of the load current output, and an output current accuracy that measures whether an arbitrarily set current value is accurately outputted. In FIGS. 3A and 4B, the ON/OFF waveform is an overwritten waveform of the output having the current set to ±25 mA, ±16 mA, and ±10 mA. In FIG. 3A, 31a and 31b show voltage characteristic performance curves when the set current is +25 mA, and −25 mA, respectively, 32a and 32b show voltage characteristic performance curves when the set current is +16 mA, and −16 mA, respectively, and 33a and 33b shows voltage characteristic performance curves when the set current are +10 mA, and −10 mA, respectively. Likewise, in FIG. 4A, In FIG. 4A, 41a and 41b show voltage characteristic performance curves when the set current is +25 mA, and −25 mA, respectively, 42a and 42b show voltage characteristic performance curves when the set current is +16 mA, and −16 mA, respectively, and 43a and 43b shows voltage characteristic performance curves when the set current are +10 mA, and −10 mA, respectively.

As is evident from FIGS. 3A and 4A, a performance equivalent to the conventional one can be obtained with respect to the load current output circuit.

The driver waveform is a waveform overwriting the waveform of output where amplitude is set to 0.8V, 1.2V, and 1.6V. In FIG. 3B, 34 shows a voltage characteristic performance curve when the set amplitude is 0.8V, 35 shows a voltage characteristic performance curve when the set amplitude is 1.2V, and 36 shows a voltage characteristic performance curve when the set amplitude is 1.6V. Likewise, in FIG. 4B, 44 shows a voltage characteristic performance curve when the set amplitude is 0.8V, 45 shows a voltage characteristic performance curve when the set amplitude is 1.2V, and 46 shows a voltage characteristic performance curve when the set amplitude is 1.6V.

In the characteristic performance curves of the driver 34 to 36 in FIG. 3B, an overshoot when the waveform rises is caused by an overshoot generation circuit provided for preventing the waveform from lacking due to a loss of the transmission line. As is evident from comparison between FIG. 3B and FIG. 4B, the present embodiment has the rising time of the waveform approximately doubles the speed thereof toward the faster DUT. Regarding the driver circuit, the present embodiment provides the performance applicable to the LSI tester.

Figures 5, 6:
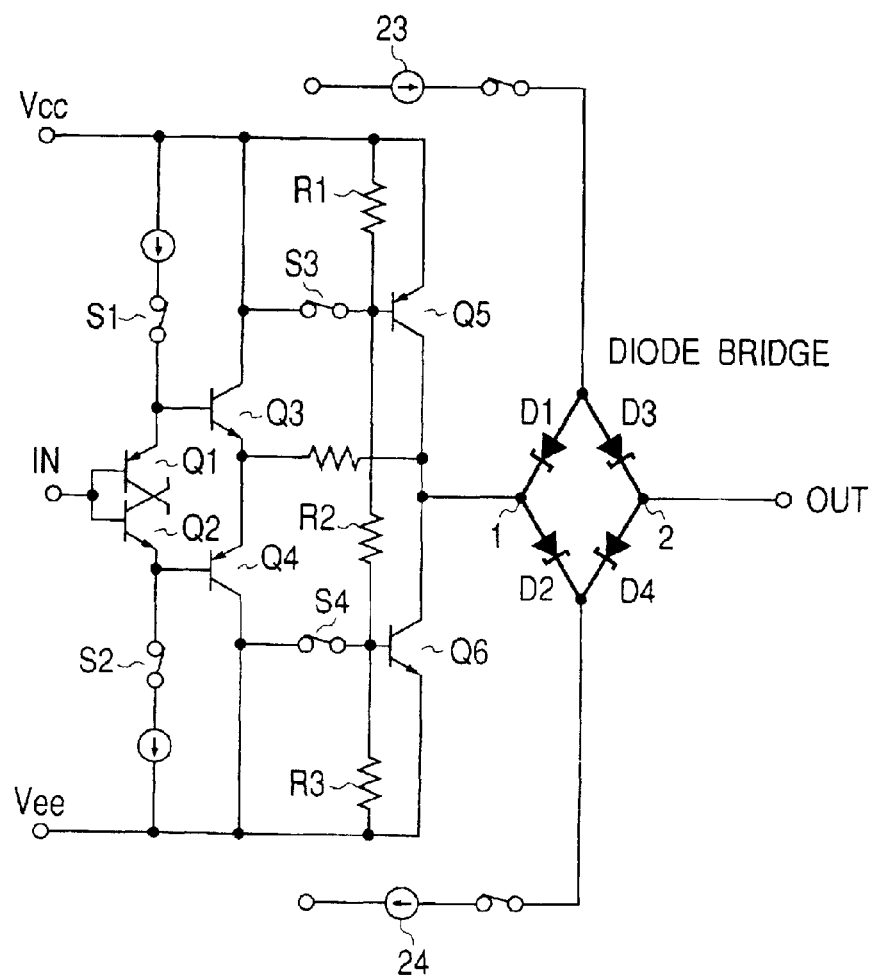
FIG. 5 is a table showing a result of simulation of conventional driver circuit and load current output circuit and a driver circuit integrated with a load current.
FIG. 6 is a circuit diagram showing another embodiment of a driver circuit integrated with a load current output circuit according to the present invention.

FIG. 5 is a table showing simulation results of the driver circuit integrated with the load current and the conventional driver circuit and the load current output circuit. With respect to the electricity consumption, while the sum of the electricity consumption of the conventional driver circuit and load current output circuit is 7.1W, the driver circuit integrated with the load current is 4.5W. Moreover, while the chip area of the conventional driver circuit is 3.7×3.7 mm² and the load current output circuit is 3.0×3.0 mm² yielding the total thereof 22.69 mm², the driver circuit integrated with the load current needs only 4.0×4.0 mm², i.e., 16.0 mm². For the mounting area, the conventional driver circuit and load current output circuit requires total of 690 mm², whereas the driver circuit integrated the load current according to the present embodiment is 460 mm², whereby there are a big different therebetween.

As seen from the table, while the performance of the circuit is the same as the conventional one, the electricity consumption and the chip area thereof can be reduced. A reduction in the chip area enables to mount on a smaller area, thus leading to a reduction of the mounting area thereof.

In the present embodiment shown in FIG. 2, as the current supplying method when the driver outputs, the switches S3, S4, S5 and S6 may be turned OFF so as to supply the driver output current from the transistors Q7 and Q8, and the diodes D1, D2, D3, and D4. Alternatively, the switches S5 and S6 may be turned OFF so as to supply the output current only from the transistors Q7 and Q8. In order to obtain greater driver output current, the former method which is capable of supplying the output current separately has advantage over the latter method because sizes of the transistors Q7 and Q8 becomes large. However, both may be used.

FIG. 6 is a circuit diagram showing another embodiment of a driver circuit integrated with a load current output circuit according to the present invention. In the present embodiment, an output stage buffer amp of the driver circuit and the load current output circuit are constituted of transistors Q5 and Q6. It is similar to the embodiment shown in FIG. 2 in a way the transistors Q5 and Q6 are turned ON as the switches S3 and S4 are turned OFF. Likewise, it is also similar to the embodiment shown in FIG. 2 in a way that the diodes D1 and D4 are turned ON when a voltage of the first terminal 1 is lower than a voltage of the second terminal 2, and the diodes D2 and D3 are turned ON when a voltage of the first terminal 1 is higher than a voltage of the terminal 2.

In the present embodiment, the transistors Q3 to Q6, and the diodes D1 to D4 operates in the same way while operating as the load current output circuit or operating as the driver circuit. When the output terminal OUT is to be set to "H", the switch S3 is turned OFF while the switch S4 is turned ON so as to turn the transistors Q3 and Q5 ON and the transistors Q4 and Q6 OFF. In this case, the diodes D2 and D3 are turned ON, and the current flows from the power source Vcc through the transistor Q5 and the diode D2, and the current further flows to the DUT through the diode D3, and the output terminal OUT from the constant current portion 23. When the output terminal OUT is to be set to "L", the switch S3 is turned ON and the switch S4 is turned OFF so as to turn the transistors Q4 and Q6 ON and the transistors Q3 and Q5 OFF. In this case, the diodes D1 and D4 are turned ON, and the current flows from the constant current portion 23 to the power source Vee through the diode D1 and the transistor Q6, and further, the current flows from the DUT to the constant current portion 24 through the diode D4. In the present embodiment, when it is used as the driver circuit, current values of the constant current portions 23 and 24 are varied between, for example, 0 to 65 mA so as to generate the voltage required for the output terminal OUT.

On the other hand, when it is used as the load current output circuit, current values of the constant current portions 23 and 24 are varied between, for example, 0 to ±25 mA so as to flow out the required current to the DUT or flow the current into the integral-type driver circuit from the DUT.

Figures 7, 8:
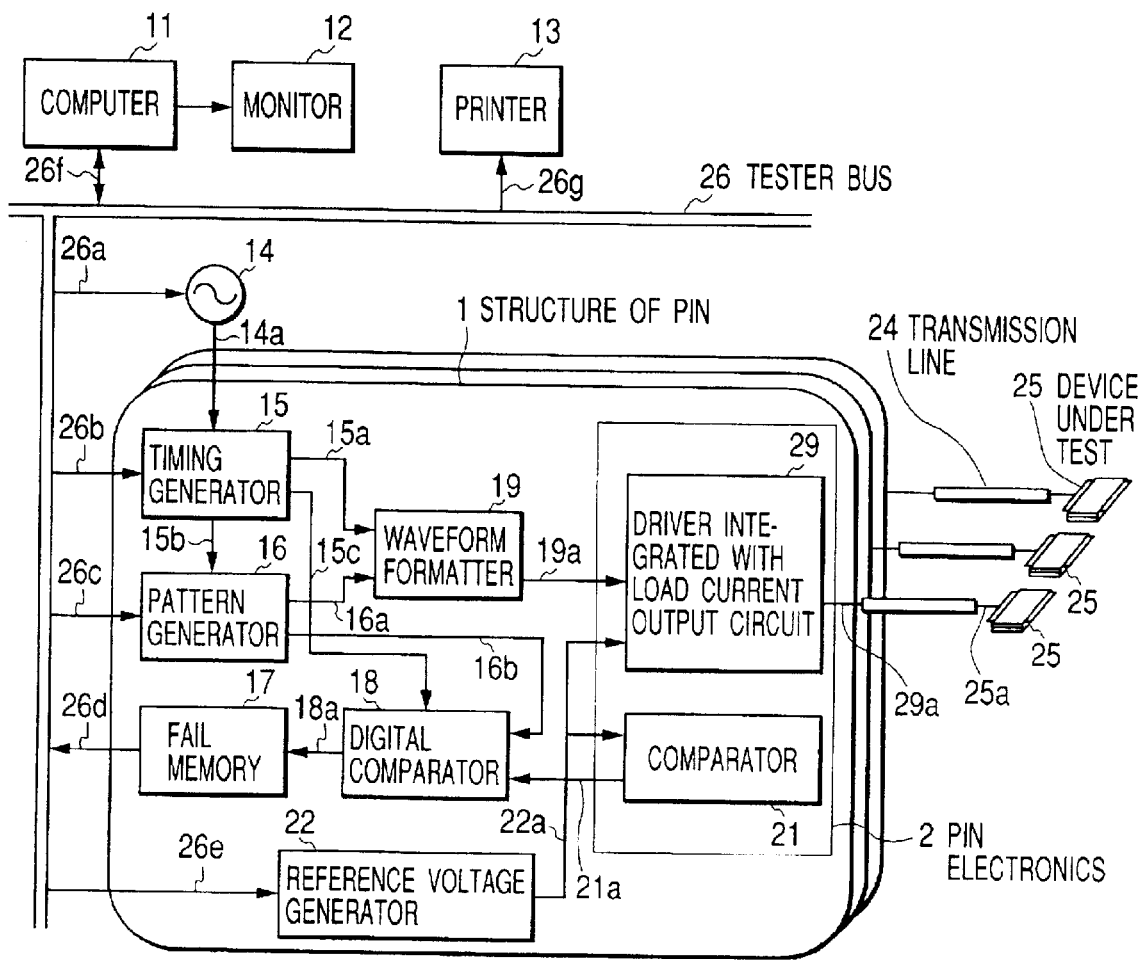
FIG. 7 is a table showing simulation result of the last stage output buffer circuit in a circuit system shown in FIGS. 2 and 6.
FIG. 8 is a block diagram showing a part of configuration of an IC tester provided with a driver circuit integrated with a load current output circuit according to the present invention.
Figure 9:
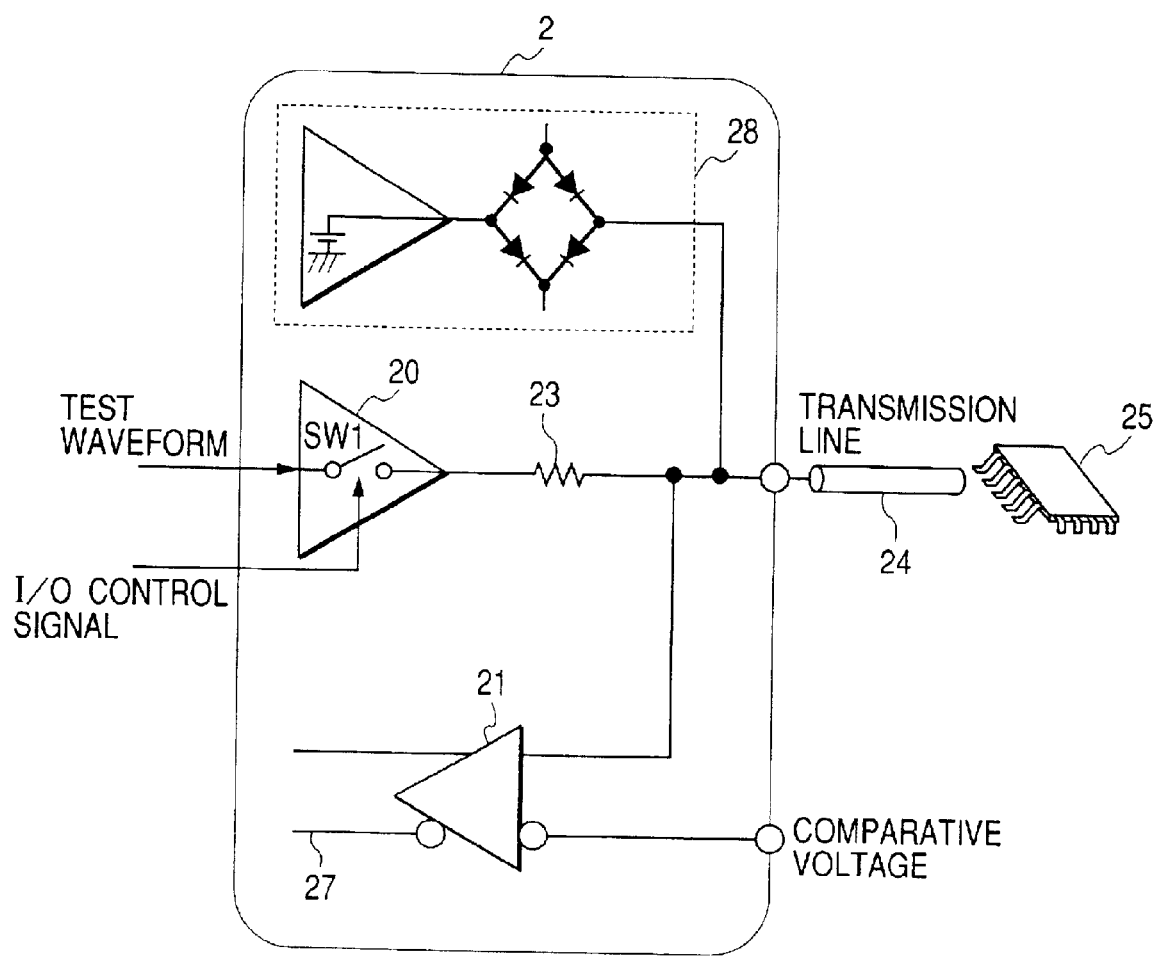
FIG. 9 is a circuit block diagram of pin electronics of a conventional IC tester.
Figure 10:
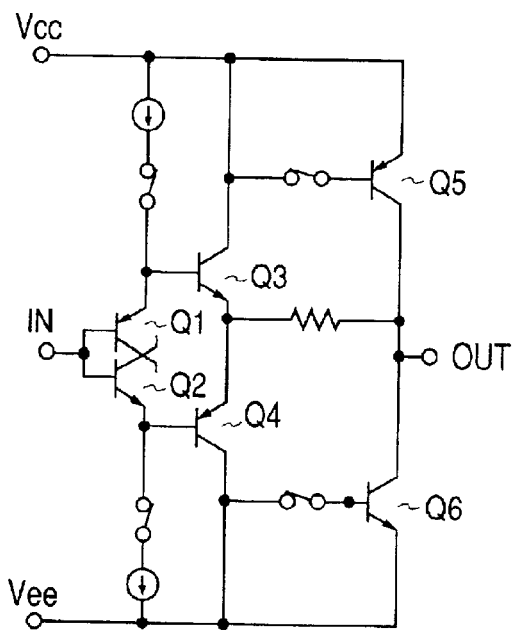
FIG. 10 shows an output buffer circuit of a conventional IC tester.
Figure 11:
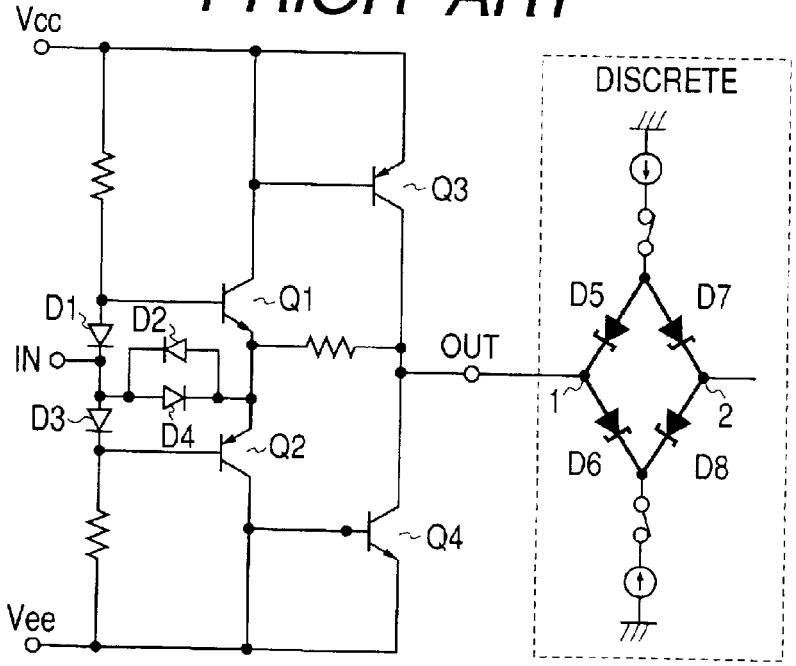
FIG. 11 shows a current buffer circuit of a conventional load current output circuit.

FIG. 7 is a table showing simulation results of the last stage output buffer circuit of the circuit systems in FIG. 2 and FIG. 6. As shown in FIG. 7, in a case of the circuit system of FIG. 6, a number of parts is less than the circuit system of FIG. 2. However, the current flowing to the diode bridge of the circuit system of FIG. 2 is the maximum current of the load current output, and the electricity consumption thereof is 700 mW, whereas, in the circuit system of FIG. 6, it is necessary to flow the maximum current of the driver, that is greater than the maximum current of the load current, to the diode, and the electricity consumption thereof becomes 1500 mW, whereby a size of the diode becomes large, thus equaling the chip area, i.e., a occupation area of parts. Moreover, because the diode of a larger size is used, the rising time of the present embodiment of FIG. 6 becomes 300 ps, thus slower than the rising time of the embodiment in FIG. 2, which is 200 ps. Moreover the electricity consumption of the system in FIG. 6 is greater than the circuit system of FIG. 2 because the current is flown to the diode while the driver is operating, and thus, comparing to the case where the current flows only to the last stage output buffer circuit, approximately double of the electricity consumption is required.

FIG. 8 is a block diagram showing a part of structure of an IC tester provided with a driver circuit integrated with a load current output circuit according to the present invention. In FIG. 8, the IC tester includes a control computer 11, a monitor 12, a printer 13, a reference signal generator 14, a timing generator 15, a pattern generator 16, a fail memory 17 for recording a comparison result, a digital comparator 18, a waveform formatter 19, a driver integrated with a load current output circuit 29, an analogue comparator 21, and a reference voltage generator 22. The reference signal generator 14 generates a reference clock 14a as a reference time for a test waveform. The timing generator 15 produces phase signals 15a, 15b, and 15c with desirable cycles and time delay by counting the reference clock 14a accordingly to a timing setting signal 26b set through a tester bus 26. The pattern generator 16 generates a pattern data signal 16a with the timing of the phase signal 15b from the timing generator 15. The waveform formatter 19 produces a test waveform 19a for testing the DUT by logically generating the pattern data signal 16a at the timing of the timing signal 15a. The driver integrated with the load current output circuit 29 shapes a waveform into a test waveform 29a of a low level or high level according to a waveform setting level signal 22a inputted from the reference voltage generator 22, and apply it to the DUT 25 through the transmission line 24. The analogue comparator 21 inputs a response wave form 25a of the DUT 25 through the transmission line 24, compares with a comparative voltage 22a generated by the reference voltage generator 22, and outputs the comparison result 21a. At that time, the driver integrated with the load current output circuit 29 serves as a load current output circuit for supplying a predetermined load current to the output terminal of the DUT 25 or as a load current for receiving a sink current. Moreover, the digital comparator 18 compares the response waveform 21a of the DUT 25 compared at the analogue comparator 21 with an expectation value signal 16b as a good response at the timing of the phase signal 15b so as to judge whether it is good or not. The judge result 18a obtained by judging good or bad of the DUT is stored in the fail memory 17, and outputs a judge result 26d to the control computer 11 through the tester bus 26 after the test is completed. The above operation is performed for each pin simultaneously so as to complete the quality judgment of the DUT 25.

In the above structure, by applying the pin electronics provided with the driver circuit integrated with the load current output circuit according to the present invention, an IC tester that consumes less power, is small, and is lower price, can be realized.

As described above, the diode bridge of the present embodiments may be a diode formed by a transistor. The output stage buffer amp of the present embodiments is not limited to an inverted Darlington constituted of a PNP transistor and NPN transistor.

As described above, the driver circuit integrated with the load current output circuit according to the present invention has a driver function for applying a predetermined test waveform to the DUT, and a load current output function for reproducing an actual use situation by receiving the load current to the DUT in order to judge a response waveform by receiving the response waveform from the DUT, both of the functions being constituted of a common circuit. The driver circuit integrated with the load current output circuit according to the present invention operates as a driver circuit when a test waveform is applied, and as a load current output circuit when judging the response waveform.

The driver circuit integrated with the load current output circuit includes a buffer circuit for a push-pull operation, a constant current portion, a current control portion constituted of an one-way conduction element that is connected to an output terminal of the buffer circuit and the constant current portion and is capable of supplying the current in the same direction or reverse direction with respect to the DUT, and provides the load current output function and the driver function by controlling the current of the constant current portion. The current control portion Is constituted of a diode bridge circuit, for example, one of a pair of terminals is connected to the buffer circuit while another serves as an output terminal connected to the DUT, and another pair of terminals are connected to the constant current portion.

As such, in the present invention, by providing functions as a load current output circuit and a driver circuit to an electronic device and sharing a common circuit for a current buffer circuit of the former and an output buffer circuit of the latter, it is possible to reduce the circuit scale and the chip area to a level smaller than having the load current output circuit and the driver circuit separately while having both functions as the load current output circuit and the driver circuit. As a result, it is also possible to reduce a mounting area of the pin electronics circuit including the driver and the load current output circuit. The electricity consumption can be also reduced compared to a case where the two circuits are provided separately, thereby the heat generating amount can be reduced.

Moreover, the pin electronics circuit can be smaller and lower-priced, whereby the IC tester using a large number of the pin electronics circuits can be smaller, and the electricity consumption thereof can also be reduced, thus lowering the heat generating amount due to lower electricity consumption.

As described above, according to the present invention, while providing the both functions as the load current output circuit and the driver circuit for the electronics device, a circuit scale and a chip area can be reduced to a level smaller than a case of providing two circuits separately, and the electricity consumption can be lowered to a level less than a case for having the both. As a result, a mounting area can be reduced, thereby reducing the heat generating amount.

The invention may be embodied in other specific forms without departing from the spirit or essential characteristics thereof. The present embodiment is therefore to be considered in all respects as illustrative and not restrictive, the scope of the invention being indicated by the appended rather than by the foregoing description and all changes which come within the meaning and range of equivalency of the claims are therefore.

What is claimed is:

1. A driver circuit integrated with a load current output circuit, comprising: a first buffer circuit having a first output terminal; a second buffer circuit having a second output terminal; and diode bridge terminals having a pair of a third and fourth output terminals each connected to said first and said second output terminals respectively enabling a first direct current to flow, wherein said fourth output terminal supplies a current as a driver when outputting a test waveform to a device under test (DUT), and said DUT supplies a load current including a second direct current to said fourth output terminal therefrom by turning the second buffer circuit OFF when judging a status of a response waveform by receiving said waveform from said DUT.

2. A driver circuit integrated with a load current output circuit according to claim 1, wherein a diode opposed to said diode bridge circuit is simultaneously turned ON, and another diode opposed thereto is simultaneously turned OFF.

3. A pin electronic IC provided with said driver circuit integrated with said load current output circuit according to claim 1.

4. An IC tester provided with said driver circuit integrated with said load current output circuit according to claim 1.

5. A driver circuit integrated with a load current output circuit according to claim 1, portion of said first buffer circuit provides a portion of said second buffer circuit.

6. A driver circuit integrated with a load current output circuit according to claim 1, wherein said first and second buffer circuits are constituted of a voltage follower of a push-pull operation, provided with a first switch circuit for controlling ON/OFF of a last stage transistor of said first buffer and a second switch circuit for controlling ON/OFF of a last stage transistor of said second buffer circuit, so that when a test waveform is outputted to a device under test (DUT), said first and second switch circuits operate said first and second buffer circuit so as to supply current from output of both said first and second buffer circuits, and when a status of a response waveform is judged by receiving a response waveform from said DUT, said second switch circuit turn said second buffer circuit into a non operative state, and said first buffer circuit is controlled by said first switch circuit so as to supply a load current to said DUT by said first buffer circuit and said diode bridge.

7. A driver circuit integrated with a load current output circuit according to claim 6, wherein a constant current portion is provided and said diode bridge circuit is connected to another pair of a fifth and sixth output terminals.

8. A driver circuit integrated with a load current output circuit, comprising:
  a first buffer circuit having a first output terminal coupled to a device under test (DUT);
  a second buffer circuit having a second output terminal coupled to the DUT; and
  diode bridge components each having third and fourth output terminals, each connected to said first and said second output terminals, the diode bridge component being configured to provide a test waveform in the form of a current including a first direct current to the DUT via the fourth output terminal, wherein the DUT supplies a load current including a second direct current to said fourth output terminal by turning OFF the second buffer circuit, so that a state of a response waveform received from the DUT may be determined.

9. A driver circuit of claim 8, wherein the first buffer circuit includes a first transistor, the first transistor providing the first output terminal, the second buffer circuit including a second transistor, the second transistor providing the second output terminal.

10. A driver circuit of claim 8, further comprising:

a first switch provided between a first power source and a control terminal of the first transistor; and a second switch provided between a second power source and a control terminal of the second transistor.

* * * * *